US008569850B2

(12) United States Patent
Kok et al.

(10) Patent No.: US 8,569,850 B2
(45) Date of Patent: Oct. 29, 2013

(54) ULTRA LOW PRESSURE SENSOR

(75) Inventors: Kitt-Wai Kok, Singapore (SG); Kok Meng Ong, Singapore (SG); Kathirgamasundaram Sooriakumar, Singapore (SG); Bryan Keith Patmon, Singapore (SG)

(73) Assignee: Sensfab Pte Ltd, Cavendish (SG)

( * ) Notice: Subject to any disclaimer, the term of this patent is extended or adjusted under 35 U.S.C. 154(b) by 600 days.

(21) Appl. No.: 12/444,837

(22) PCT Filed: Oct. 10, 2007

(86) PCT No.: PCT/MY2007/000067
§ 371 (c)(1), (2), (4) Date: Apr. 8, 2010

(87) PCT Pub. No.: WO2008/044910
PCT Pub. Date: Apr. 17, 2008

(65) Prior Publication Data

US 2010/0187646 A1 Jul. 29, 2010

(30) Foreign Application Priority Data

Oct. 11, 2006 (MY) ................................ PI20064309

(51) Int. Cl.
*H01L 29/84* (2006.01)

(52) U.S. Cl.
USPC ........... 257/419; 257/415; 257/416; 257/417; 257/418; 257/420; 257/E21.515; 257/E21.518; 257/E21.519; 257/E23.078; 257/E27.006; 257/E29.324

(58) Field of Classification Search
USPC .................. 257/415–420, E21.515, E21.518, 257/E21.519, E23.078, E27.006, E29.324
See application file for complete search history.

(56) References Cited

U.S. PATENT DOCUMENTS

| | | | | |
|---|---|---|---|---|
| 5,408,731 | A | 4/1995 | Berggvist et al. | |
| 5,490,220 | A | 2/1996 | Loeppert | |
| 5,573,679 | A * | 11/1996 | Mitchell et al. | 216/2 |
| 5,684,324 | A * | 11/1997 | Bernstein | 257/415 |
| 5,706,565 | A | 1/1998 | Sparks et al. | |
| 5,959,338 | A * | 9/1999 | Youngner et al. | 257/419 |
| 6,229,190 | B1 * | 5/2001 | Bryzek et al. | 257/419 |
| 6,595,066 | B1 | 7/2003 | Kurtz et al. | |
| 6,743,654 | B2 * | 6/2004 | Coffa et al. | 438/52 |
| 6,901,804 | B2 * | 6/2005 | Torkkeli | 73/716 |
| 7,190,038 | B2 * | 3/2007 | Dehe et al. | 257/415 |

(Continued)

FOREIGN PATENT DOCUMENTS

| | | | |
|---|---|---|---|
| EP | 1292171 | A2 | 3/2003 |
| EP | 1469701 | A2 | 10/2004 |

(Continued)

*Primary Examiner* — Ida M Soward
(74) *Attorney, Agent, or Firm* — Kilpatrick Townsend & Stockton LLP

(57) ABSTRACT

A sensor for acoustic applications such as a silicone microphone is provided containing a backplate provided with apertures and a flexible diaphragm formed from a silicon on insulator (SOI) wafer which includes a layer of heavily doped silicon, a layer of silicon and an intermediate oxide layer that is connected to, and insulated from the backplate. The arrangement of the diaphragm in relation to the rest of the sensor and the sensor location, being mounted over the aperture in a PCB, reduces the acoustic signal pathway which allows the sensor to be both thinner and more importantly, enables there to be a greater back volume.

4 Claims, 7 Drawing Sheets

(56) References Cited

U.S. PATENT DOCUMENTS

| | | | | |
|---|---|---|---|---|
| 7,275,298 | B2 * | 10/2007 | Schindel | 29/594 |
| 7,329,933 | B2 * | 2/2008 | Zhe et al. | 257/419 |
| 7,473,572 | B2 * | 1/2009 | Dehe et al. | 438/48 |
| 7,570,775 | B2 * | 8/2009 | Araki | 381/191 |
| 7,642,575 | B2 * | 1/2010 | Wong et al. | 257/254 |
| 7,706,554 | B2 * | 4/2010 | Ogura et al. | 381/175 |
| 7,714,421 | B2 * | 5/2010 | Kim et al. | 257/678 |
| 7,853,027 | B2 * | 12/2010 | Yamaoka et al. | 381/174 |
| 7,952,781 | B2 * | 5/2011 | Weiss et al. | 359/201.1 |
| 8,130,979 | B2 * | 3/2012 | Harney et al. | 381/94.7 |
| 2005/0179100 | A1 * | 8/2005 | Barzen et al. | 257/415 |
| 2007/0045757 | A1 * | 3/2007 | Matsubara et al. | 257/416 |
| 2007/0065968 | A1 * | 3/2007 | Kok et al. | 438/53 |
| 2008/0031476 | A1 * | 2/2008 | Wang et al. | 381/174 |
| 2008/0055079 | A1 * | 3/2008 | Fraden | 340/544 |
| 2008/0175417 | A1 * | 7/2008 | Kok et al. | 381/174 |
| 2008/0185669 | A1 * | 8/2008 | Kok et al. | 257/416 |
| 2009/0079017 | A1 * | 3/2009 | Fujii | 257/415 |
| 2010/0044808 | A1 * | 2/2010 | Dekker et al. | 257/415 |
| 2011/0103622 | A1 * | 5/2011 | Weigold | 381/174 |

FOREIGN PATENT DOCUMENTS

| | | | |
|---|---|---|---|
| WO | WO/01/78448 | | 10/2001 |
| WO | WO/2004/105428 | A1 | 12/2004 |
| WO | WO/2006/049583 | A1 | 5/2006 |
| WO | WO/2002/124002 | A1 | 11/2006 |

* cited by examiner

ULTRA LOW PRESSURE SENSOR

FIELD OF THE INVENTION

The present invention relates to a sensor, particularly an ultra-low pressure sensor and method for the fabrication of same. In particular, the invention relates to an ultra-low pressure sensor for acoustic application, for example in the form of a silicon microphone, and a method for the fabrication of such a sensor.

BACKGROUND

A capacitive microphone typically includes a diaphragm having an electrode attached to a flexible member and a backplate parallel to the flexible member attached to another electrode. The backplate is relatively rigid and typically includes a plurality of holes to allow air to move between the backplate and the flexible member. The backplate and flexible member form the parallel plates of a capacitor. Acoustic pressure on the diaphragm causes it to deflect which changes the capacitance of the capacitor. The change in capacitance is processed by electronic circuitry to provide an electrical signal that corresponds to the change.

Microelectronic mechanical devices (MEMS), including miniature microphones, are fabricated with techniques commonly used for making integrated circuits. Potential uses for MEMS microphones include microphones for hearing aids and mobile telephones, and pressure sensors for vehicles.

Many available MEMS microphones involve a complex fabrication process that includes numerous masking and etching steps. As the complexity of the fabrication process increases there is a greater risk of the devices failing the testing process and being unusable.

Applicant has proposed a number of methods for the fabrication of pressure sensors, such as silicon microphones. For example, International Publication WO2004105428 describes a silicon microphone of the above type that includes a flexible diaphragm that extends over an aperture. A backplate is also provided that combines with the flexible diaphragm to form the parallel plates of a capacitor for the microphone. However, this and many of the prior art examples are so-called "top-side" application sensors. That is, in use the sensor is packaged in a device, for example a mobile telephone, such that an acoustic signal travels through a hole in the device and is indirectly received by the sensor. This arrangement will be described in further detail below.

SUMMARY OF THE INVENTION

The present invention advantageously provides an arrangement that facilitates bottom-side application of a sensor, thereby reducing a signal pathway, for example an acoustic signal pathway, to the sensor in use.

According to one aspect of the invention there is provided a sensor including:

- a backplate of electrically conductive or semi-conductive material, the backplate including a plurality of backplate holes;
- a diaphragm of electrically conductive or semi-conductive material that is connected to, and insulated from the backplate, the diaphragm defining a flexible member and an air gap associated with the flexible member;
- a bond pad formed on an area of the backplate surrounding the cavity; and
- a bond pad formed on an area of the diaphragm surrounding the air gap;
- wherein the flexible member and air gap defined by the diaphragm extend beneath the plurality of backplate holes.

It will be appreciated that the diaphragm must be insulated from the backplate in order for the sensor to function. This may be achieved by any suitable means. Preferably, however, the diaphragm is insulated from the backplate by an oxide layer.

The materials used to form the backplate and the diaphragm of the sensor may be selected from materials known in the art. That is, the materials forming the backplate and diaphragm may be any highly doped material, for example any p+ or n+ material. Preferably, the backplate is formed from a silicon wafer including an oxide layer on at least one side thereof, and the diaphragm is formed from a silicon-on-insulator (SOI) wafer including a layer of heavily doped silicon, a layer of silicon and an intermediate oxide layer. Alternatively, the diaphragm may be formed from doped polysilicon.

The sensor may, if desired, include a support member associated with the diaphragm. If so, the support member preferably includes a glass wafer bonded with the diaphragm. The glass wafer may be formed from Borofloat™ glass manufactured by Schott, or a borosilicate glass such as Pyrex™ manufactured by Corning.

In a preferred embodiment, the backplate includes a cavity extending above the plurality of backplate holes. This advantageously minimizes the distance between the openings of the plurality of holes to the air gap, and therefore the distance to the flexible member of the diaphragm.

According to another aspect of the invention there is provided a method of manufacturing a sensor including:

- providing a first wafer including a layer of heavily doped silicon, a layer of silicon and an intermediate oxide layer, the layer of heavily doped silicon defining a first major surface of the first wafer and the layer of silicon defining a second major surface of the first wafer;
- providing a second wafer of heavily doped silicon having a first major surface and a second major surface;
- forming a layer of oxide on at least the first major surface of the first wafer;
- forming a layer of oxide on at least the first major surface of the second wafer;
- patterning and etching a cavity through the oxide layer on the first major surface of the first wafer and into the layer of heavily doped silicon of the first wafer;
- patterning and etching contact cavities through the oxide layer on the first major surface of the first wafer and through the layer of heavily doped silicon of the first wafer;
- bonding the first major surface of the first wafer to the first major surface of the second wafer such that the cavity formed in the first major surface of the first wafer defines an air gap between the first wafer and the second wafer;
- patterning and etching a cavity into the layer of silicon defining the second major surface of the first wafer thereby forming a flexible member from the layer of heavily doped silicon of the first wafer, the flexible member being associated with the air gap formed between the first wafer and the second wafer;
- thinning the second wafer at its second major surface;
- patterning and etching a plurality of holes in the second major surface of the second wafer, the plurality of holes being associated with the air gap formed between the first wafer and the second wafer; and forming at least one bond pad on the layer of heavily doped silicon of the first wafer and at least one bond pad on the second wafer.

It is noted that the above steps of the method of the invention need not be performed in the order described. Those of skill in the art will appreciate that the order as recited may be varied while achieving the same result. Such variations fall within the ambit of the method of the invention.

Once again, in certain embodiments and applications it may be desirous to include a support member. As such, the method preferably includes bonding a support member to the second major surface of the first wafer at any stage after patterning and etching of the cavity into the layer of silicon defining the second major surface of the first wafer. The support member may be formed from any suitable material as discussed above.

In order to minimize the travel distance between the openings of the plurality of holes formed in the second major surface of the second wafer to the flexible member, as also highlighted above, the method preferably includes patterning and etching a cavity in the second major surface of the second wafer prior to the step of patterning and etching the plurality of holes in the second major surface of the second wafer.

According to a further aspect of the invention there is provided a device including:

a printed circuit board (PCB); and a sensor as described above associated with the printed circuit board;

wherein the printed circuit board includes and aperture over which the sensor is mounted such that any signal passing through the aperture is in direct communication with the flexible member of the diaphragm of the sensor.

As noted previously, a particular application of the sensor of the invention is as an acoustic sensor. Therefore, in a preferred embodiment the signal is an acoustic signal.

BRIEF DESCRIPTION OF THE DRAWINGS

A more detailed description of the invention will now be provided by way of example only with reference to the accompanying drawing. It should be appreciated, however, that the drawings should not be construed as limiting on the invention in any way. Referring to the drawings.

DETAILED DESCRIPTION OF THE INVENTION

The sensor and method of fabricating the sensor will be described with reference to one particular embodiment of the sensor. It should be appreciated, as noted above, that this description is not intended to limit the invention. It should also be noted that the drawings illustrated are not drawn to scale and are given for illustrative purposes only.

Figure 1:
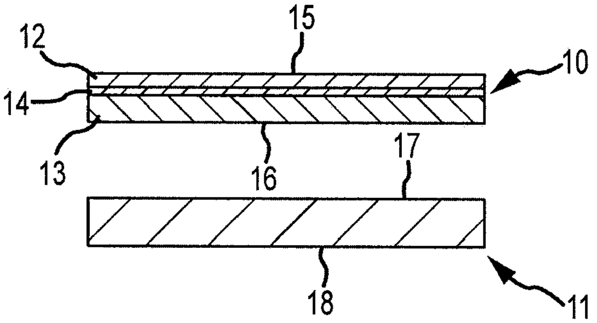
FIG. 1 illustrates a cross-sectional side view of the first wafer and second wafer before fabrication.

FIG. 1 is a side view of a first wafer 10 and a second wafer 11 to be used to fabricate a sensor. The first wafer 10 includes a first layer 12 of highly doped silicon, a second layer 13 of silicon substrate and an intermediate oxide layer 14. The first layer 12 may include $p^{++}$ doped silicon and the second layer 13 may include an n-type substrate. Alternatively, the first layer 12 may include an $n^{++}$ doped silicon and the second layer 13 may include a p-type substrate.

Typically, the first layer 12 is of the order of 4 microns thick and the oxide layer 14 is of the order of 2 microns thick. The thickness of these layers will generally depend on the characteristics required for the sensor. The second layer 13 may be larger than the first layer 12 and the oxide layer 14. For example, the second layer 13 may be in the order of 400 to 600 microns thick.

The second wafer 11 is formed from silicon. The second wafer 11 is heavily doped and may be either p-type or n-type silicon. In certain embodiments, the second wafer 11 is formed from <100> silicon. In other embodiments, different silicon surfaces or structures may be used.

It will be appreciated that the first wafer 10 includes a first major surface 15 formed from the heavily doped silicon of the first layer 12 and a second major surface 16 formed from the silicon of the second layer 13. Likewise, the second wafer 11 includes a first major surface 17 and a second major surface 18 formed from the heavily doped silicon of the second wafer 11.

In fabricating the sensor, the first wafer 10 and the second wafer 11 are initially processed separately before being bonded together and further processed.

Figure 2:
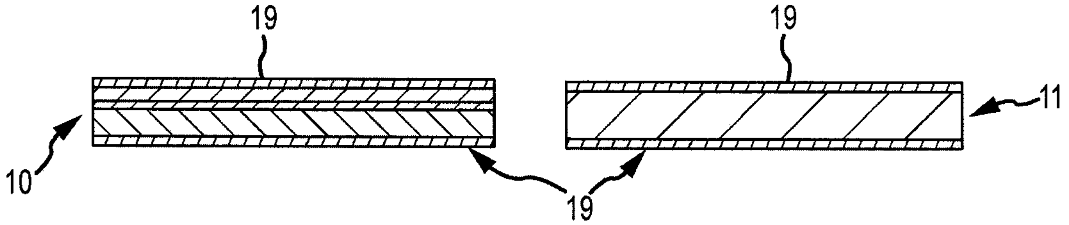
FIG. 2 illustrates a cross-sectional side view of the first wafer and the second wafer following oxide deposition.

FIG. 2 shows the first wafer 10 and second wafer 11 after oxide layers 19 have been formed on the major surfaces 15-17 of the wafers 10 and 11. An oxide layer 19 is typically formed on the major surfaces 15-17 of the wafers 10 and 11 through thermal growth or a deposition process. Forming oxide layers 19 on both major surfaces 15-16 and 17-18 of the first wafer 10 and second wafer 11 respectively reduces the risk of distorting the wafer that may occur if oxide were only formed on one major surface on each wafer. That being said, it an alternative embodiment to that illustrated an oxide layer 19 is only formed on the first major surface 15 of the first wafer 10 and the first major surface 17 of the second wafer 11. The thickness of the oxide layers 19 is less than the thickness of the first and second wafers 10 and 11.

It is to be understood that any other suitable dielectric or insulating material, for example silicon nitride, may be used in place of the oxide layers 19.

Figure 3:
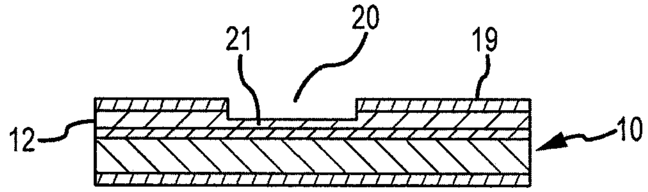
FIG. 3 illustrates a cross-sectional side view of the first wafer following patterning and etching of a cavity.

FIG. 3 illustrates the first wafer 10 in which a cavity 20 has been patterned and etched. In particular, the cavity 20 has been patterned and etched through the oxide layer 19 on the first major surface 15 of the first layer 12 of the first wafer 10, and into the first layer 12 of the first wafer 10. In this step, a portion of the heavily doped silicon forming the first layer 12 is etched away to produce a thin section 21 of the heavily doped silicon of the first layer 12.

The thickness of the thin section 21 will determine the properties of the sensor eventually fabricated as this thin section 21 of highly doped silicon will form the flexible member of the diaphragm of the sensor, as illustrated in the following drawings.

A wet or dry silicon etch may be employed in this step. In one embodiment a reactive ion etch (RIE) is used to form the cavity 20. Generally, the etch is a time etch. Therefore, the final thickness of the thin section 21, and consequently the flexible member of the diaphragm, is dependent on the etching time. Further, the desired shape of the cavity 20 will generally be dictated by the desired properties of the sensor.

Figure 4:
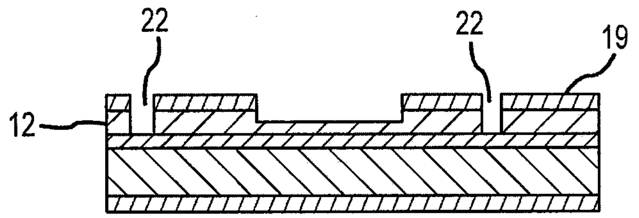
FIG. 4 illustrates a cross-sectional side view of the first wafer following additional patterning and etching of contact cavities.

Following etching of the cavity 20 into the first layer 12 of the first wafer 10, contact cavities 22, illustrated in FIG. 4, are patterned and etched into the first layer 12 of the first wafer 10 through the oxide layer 19. These cavities 22 extend through the first layer 12 to the oxide layer 14 of the first wafer 10. Again, any suitable etching process may be employed to form the contact cavities 22.

Figure 4A:
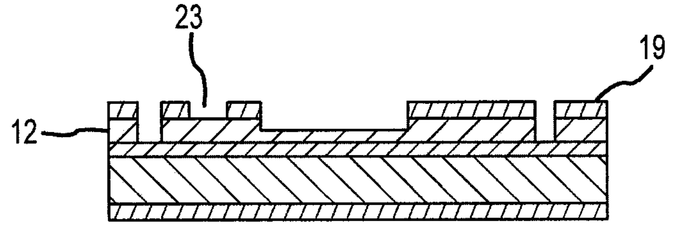
FIG. 4A illustrates a cross-sectional side view of the first wafer following additional patterning and etching of the oxide layer.

Referring to FIG. 4A, at this stage a bond pad cavity 23 may optionally be formed by patterning and etching the oxide layer 19 formed on the first major surface 15 of the first layer 12 of the first wafer 10. This may again be achieved through any suitable etching process.

Figure 5:
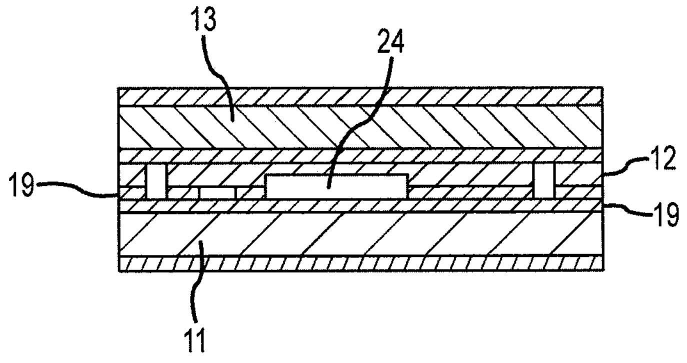
FIG. 5 illustrates a cross-sectional side view of the first wafer and the second wafer bonded together.

As shown in FIG. 5, the first and second wafers 10 and 11 are bonded together. The major surfaces bonded together, via respective oxide layers 19, are the first major surface 15 of the first wafer 10 and the first major surface 17 of the second wafer 11. In one embodiment the wafers 10 and 11 are bonded together through their respective oxide layers 19 using fusion bonding.

In bonding the wafers 10 and 11 together, an air gap 24 is formed between the wafers 10 and 11 corresponding with the cavity 20 formed in a previous etching step.

Figure 6:
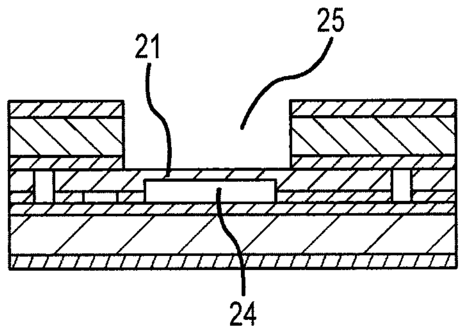
FIG. 6 illustrates a cross-sectional side view of the bonded wafers following patterning and etching to form the flexible member.

Referring to FIG. 6, following bonding of the two wafers 10 and 11 a cavity 25 is patterned and etched through the oxide layer 19 formed on the second major surface 16 of the first wafer 10, through the silicon of the second layer 13 of the first wafer 10 and through the intermediate oxide layer 14 of the first wafer 10. The cavity is formed in a position corresponding to the position of the air gap 24. Thus, the thin section 21 previously formed is exposed to the cavity 25.

Figure 6A:
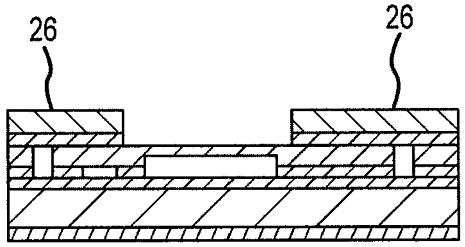
FIG. 6A illustrates a cross-sectional side view of the bonded wafers following thinning of the second major surface of the first wafer.
Figure 6B:
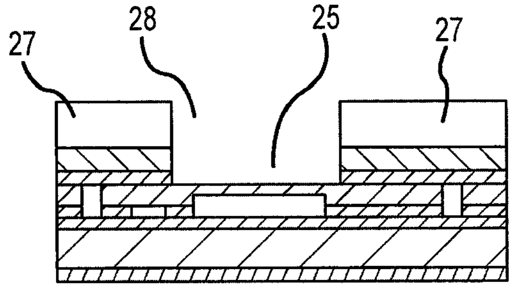
FIG. 6B illustrates a cross-sectional side view of the bonded wafers following bonding of a support member.

If a support member, such as a glass wafer support, is desired, this may be applied as illustrated in FIGS. 6A and 6B. In this embodiment, the oxide layer 19 formed on the second major surface 16 of the first wafer 10 and a portion of the second major surface 16 are subjected to a grinding operation to thin the second layer 13 of the first wafer 10. This produces ground surfaces 26 on the first wafer 10. It should, however, be understood that any other suitable method for removal of the oxide layer 19 and thinning of the second layer 13 may be employed.

After thinning of the second layer 13, a glass wafer 27 that has been previously prepared is bonded to the ground surfaces 26 of the second layer 13. The glass wafer 27 includes a central aperture 28 that cooperates with the previously formed cavity 25. This ensures that the sensor will function correctly when fabrication is completed.

If the glass wafer 27 is not provided with an aperture, one may be formed in the glass wafer 27. For example, if the glass wafer 27 is solid, this may itself be patterned and etched to provide the aperture 28. In such a case, a masking layer of chrome may be deposited onto the glass wafer 27 and the aperture 28 formed by wet or dry etching, for example using HF.

Figure 7:
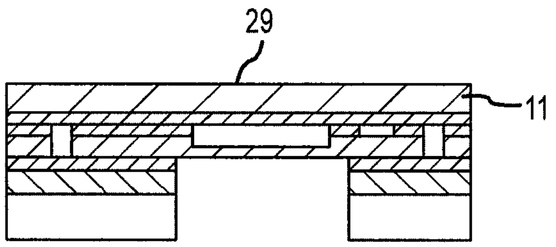
FIG. 7 illustrates a cross-sectional side view of the bonded wafers following thinning of the second major surface of the second wafer.
Figure 7A:
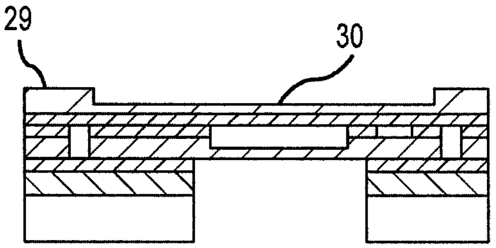
FIG. 7A illustrates a cross-sectional side view of the bonded wafers following patterning and etching of a cavity in the second wafer.
Figure 8:
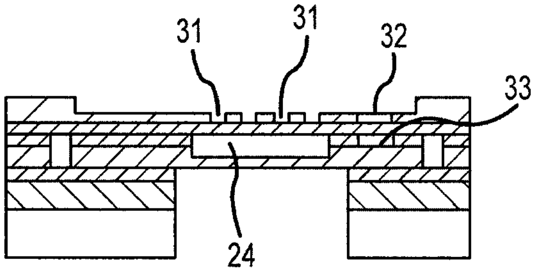
FIG. 8 illustrates a cross-sectional side view of the bonded wafers following patterning and etching of holes in the second wafer.
Figure 9:
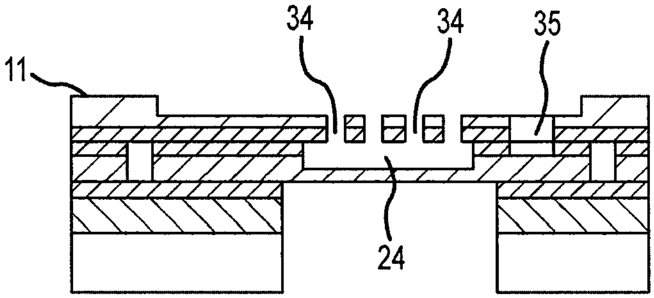
FIG. 9 illustrates a cross-sectional side view of the bonded wafers following global etching of the holes in the second wafer.

As illustrated in FIG. 7, following etching of the cavity 25 in the second layer 13 of the first wafer 10, and optionally after bonding of the glass wafer 27 to the second layer 13, the second major surface 18 of the second wafer 11 and the oxide layer 19 formed on it are subjected to grinding. This leaves a ground surface 29 of the second wafer 11 exposed. Optionally a cavity 30 may be formed in the second wafer 11 by patterning and etching the, ground surface 29 of the second wafer 11. It will be appreciated that grinding of the second major surface 18 of the second wafer 11 and the oxide layer 19 may be conducted prior to etching of the cavity 25.

A plurality of holes 31 are then patterned and etched into the highly doped silicon of the second wafer 11 in a region associated with the air gap 24 and, therefore, the thin section 21. A further small cavity 32 is also etched into the second wafer 11. This cavity 32 is associated with an air gap 33 formed by the bond pad cavity 23 (illustrated in FIG. 4A) when the first and second wafers 10 and 11 are bonded together, as illustrated in FIG. 5. When the holes 31 and small cavity 32 are formed, a global etch is conducted such that the holes 31 extend through to the air gap 24 and the small cavity 32 extends through to the air gap 33. In effect, channels 34 are formed that extend through the second wafer 11 to the air gap 24, and a deeper cavity 35 is formed.

Figure 10:
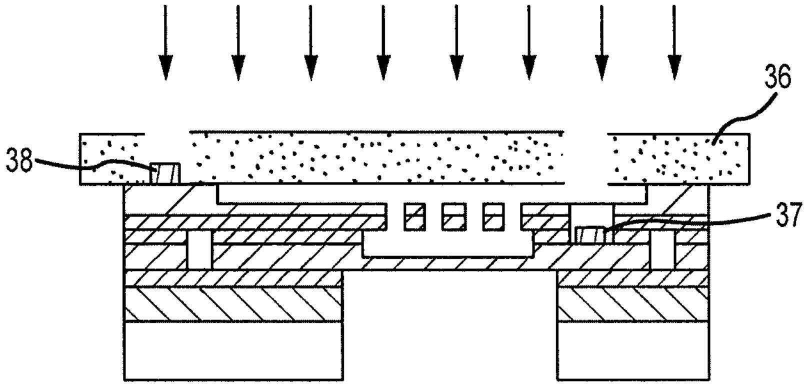
FIG. 10 illustrates a cross-sectional side view of the formation of bond lads on the first wafer and the second wafer by deposition.

Referring to FIG. 10, following formation of the channels 34 by global etching, a shadow mask 36 is put in place over the second wafer 11 and bond pads 37 and 38 are deposited, for example by deposition of aluminium. A first bond pad 37 is deposited on an area of the first wafer 10 exposed through the cavity 35, while a second bond pad 38 is deposited on an area of the second wafer 11.

Figure 11:
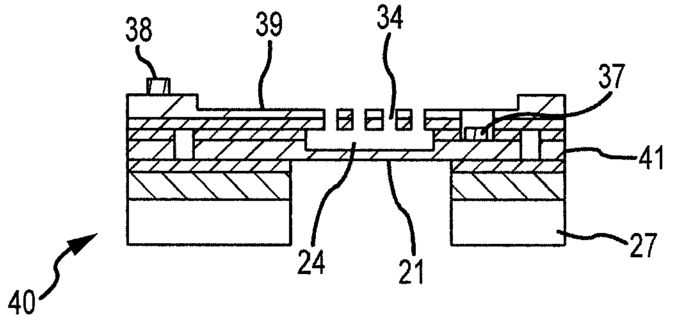
FIG. 11 illustrates a cross-sectional side view of an ultra-low pressure sensor.
Figure 12:
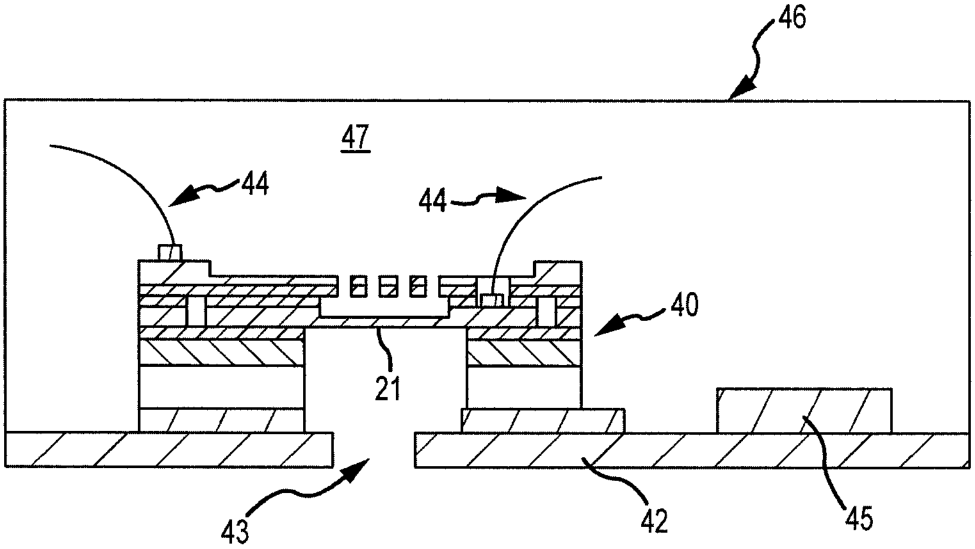
FIG. 12 illustrates a cross-sectional side view of a device incorporating a prior art sensor and packaging method.

When fabrication is complete, a sensor 40 is provided as illustrated in FIG. 11. This includes a backplate 39 formed from the second wafer 11 that includes a plurality of channels 34. The plurality of channels 34 extend to an air gap 24 defined by the first wafer 10. A thin section 21 is associated with the air gap 24 and defines a flexible member of the diaphragm 41. A pair of bond pads 37 and 38 are associated with the first wafer 10 and second wafer 11 respectively. It will be appreciated from FIG. 11 that the sensor is formed such that the backplate 39 and therefore the channels 34 extending through the backplate 39 are located above the flexible member defined by the thin section 21. This advantageously facilitates so-called "bottom side" application as illustrated in FIG. 12.

As illustrated, the sensor 40 is mounted on a PCB 42 such that the sensor 40 straddles an aperture 43 in the PCB 42. As such, any signal passing through the aperture 43 is in direct communication with the flexible member defined by the thin section 21 of the diaphragm 41 of the sensor 40. The bond pads 37 and 38 are associated with wires 44 that may be connected with other components 45 of a device. A cap 46 of the device defines a back volume 47 surrounding the sensor 40.

Figure 13:
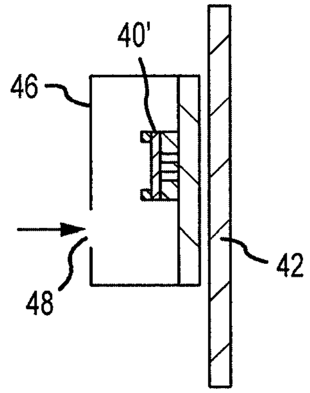
FIG. 13 illustrates a cross-sectional side view of a device incorporating a prior art sensor and alternative packaging method.
Figure 14:
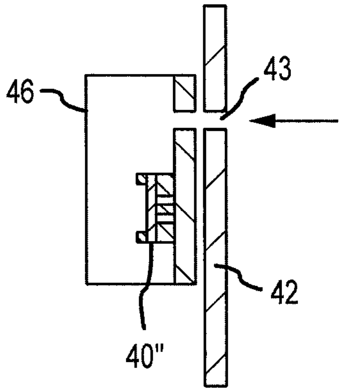
FIG. 14 illustrates a cross-sectional side view of a device incorporating a sensor according to the invention.

Referring to FIGS. 13 to 14, a number of packages are illustrated. In FIG. 13 an arrangement is illustrated where a prior art top-side application sensor 40' is mounted on a PCB 42. An aperture 48 is provided in the cap 46 to allow a signal, such as an acoustic signal (designated with an arrow in FIGS. 13 to 15) to pass through the cap 46 to the sensor 40'.

Another alternative of the prior art is illustrated in FIG. 14, where a sensor 40" is mounted on a PCB 42. In this arrangement an aperture 43 is provided in the PCB 42 rather than in the cap 46. However, as the sensor 40" is a top-side application sensor, it cannot be mounted over the aperture 43. Rather, it must be mounted in a position remote from the aperture 43.

Figure 15:
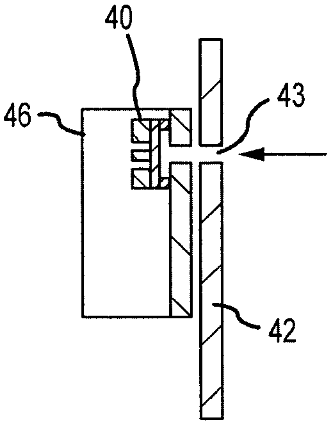
FIG. 15 illustrates a cross-sectional side view of a device incorporating a sensor according to the invention mounted over an aperture.

As already described, the sensor 40 of the present invention has the advantage of being able to be mounted over the aperture 43 as illustrated for comparative purposes in FIG. 15. Therefore, the signal, designated by the arrow, can travel directly to the sensor 40 and in particular the flexible member of the sensor 40.

The sensor according to the invention may provide a number of advantages. In particular, the positioning of the sensor on a PCB as described above may advantageously alleviate problems associated with moisture entering the package. More importantly, the sensor allows for arrangement having a large back volume. With regard to acoustic applications, back volume is important to the acoustic performance of a device as it affects sensitivity. The bottom side application method simply allows the total volume enclosed to be the back volume, greatly improving sensitivity. Also, with bottom side application, a hole can be punched in a front of the device, for example the front keypad area of a mobile phone, and with a hole drilled in the PCB sound can travel directly to the sensor. This shorter path of travel enables a lower device profile since no air channel is needed below the hole.

The foregoing describes the invention including preferred forms thereof. Alterations and modifications as will be obvious to those of skill in the art are intended to be incorporated in the scope hereof as defined by the accompanying claims.

The invention claimed is:

1. A sensor including:

a backplate including a plurality of backplate holes;

a cavity extending above the plurality of backplate holes;

a diaphragm of electrically conductive or semi-conductive material that is connected to, and insulated from the backplate, the diaphragm defining a flexible member and an air gap extending below the plurality of backplate holes and associated with the flexible member;

a first bond pad formed on an area of the back plate surrounding the cavity; and a second bond pad formed on an area of the diaphragm surrounding the air gap;

wherein the flexible member and air gap defined by the diaphragm extend beneath the plurality of backplate holes, wherein the diaphragm is formed from silicon-on-insulator (SOI) wafer including a layer of heavily doped silicon, a layer of silicon and an intermediate oxide layer, and wherein the backplate is formed from a silicon wafer including an oxide layer on only one side thereof.

2. A sensor according to claim 1, including a support member associated with the face of the diaphragm which faces away from the backplate and wherein the support member includes a glass wafer bonded with the diaphragm.

3. A device including:

a printed circuit board (PCB); and a sensor according to claim 1 associated with the printed circuit board;

wherein the printed circuit board includes an aperture over which the sensor is mounted such that any signal passing through the aperture is in direct communication with the flexible member of the diaphragm of the sensor.

4. A device according to claim 3, wherein the signal is an acoustic signal.

* * * * *